US005593532A

United States Patent [19]
Falk et al.

[11] Patent Number: 5,593,532
[45] Date of Patent: Jan. 14, 1997

[54] PROCESS FOR MANUFACTURING PHOTOVOLTAIC MODULES

[75] Inventors: Johann Falk, Graz; Albert K. Plessing, Brunn, both of Austria

[73] Assignee: Isovolta Osterreichische Isolierstoffwerke Aktiengesellschaft, Austria

[21] Appl. No.: 374,523

[22] PCT Filed: Jun. 7, 1994

[86] PCT No.: PCT/AT94/00073

§ 371 Date: Jan. 31, 1995

§ 102(e) Date: Jan. 31, 1995

[87] PCT Pub. No.: WO94/29106

PCT Pub. Date: Dec. 22, 1994

[30] Foreign Application Priority Data

Jun. 11, 1993 [AT] Austria ................ 1132/93

[51] Int. Cl.$^6$ ................ B32B 31/20; H01L 31/04
[52] U.S. Cl. ................ 156/285; 156/286; 156/311; 156/308.2; 156/309.6; 156/382; 156/583.3
[58] Field of Search ................ 156/285, 286, 156/382, 583.3, 308.2, 311, 359, 309.6

[56] References Cited

U.S. PATENT DOCUMENTS

| | | | |
|---|---|---|---|
| 3,711,939 | 1/1973 | Stoll | 156/382 |
| 4,067,764 | 1/1978 | Walker et al. | 156/308.2 |
| 4,401,839 | 8/1983 | Pyle | 136/251 |
| 4,421,589 | 12/1983 | Armini et al. | 156/382 |
| 4,433,200 | 2/1984 | Jester et al. | 136/251 |
| 4,543,147 | 9/1985 | Noto et al. | 156/311 |
| 4,689,105 | 8/1987 | Fazlin et al. | 156/382 |
| 4,806,195 | 2/1989 | Namysl | 156/382 |
| 4,997,507 | 3/1991 | Meyer | 156/311 |
| 5,399,223 | 3/1995 | Vogt | 156/285 |
| 5,472,541 | 12/1995 | Simmons et al. | 156/311 |

FOREIGN PATENT DOCUMENTS

| | | |
|---|---|---|
| 0392226 | 10/1990 | European Pat. Off. . |
| 0442702 | 8/1991 | European Pat. Off. . |
| 0528566 | 2/1993 | European Pat. Off. . |
| 3725007 | 2/1989 | Germany . |
| 9110914 | 5/1992 | Germany . |
| WO92/06847 | 4/1992 | WIPO ................ 156/382 |

*Primary Examiner*—Michele K. Yoder
*Attorney, Agent, or Firm*—Bacon & Thomas

[57] ABSTRACT

The invention concerns a process and equipment for manufacturing laminated photovoltaic modules, where (a) a module-stack (2) formed by the system of solar cells, the encapsulating materials and the separating foils is deposited at the loading station (1) and where (b) the module-stack (2) is moved into the vacuum laminator (5) which thereupon is closed and evacuated, and, by pressing the heater plate (21) against the thermally conductive carrier plate (3), said stack is heated to the softening point of the plastic sealing layers present in the encapsulating materials, and where (c) following airing of the vacuum laminator (5) the heater plate (21) is not cooled and the formed composite (2') is moved into the hardening oven (10) and where (d) the hardened laminate (2") is then moved into the cooling zone (12) and (e) is removed from the manufacturing process at the removal station (14). The process stages (a) through (e) of the invention are carried out simultaneously and parallelly in timed manner.

9 Claims, 3 Drawing Sheets

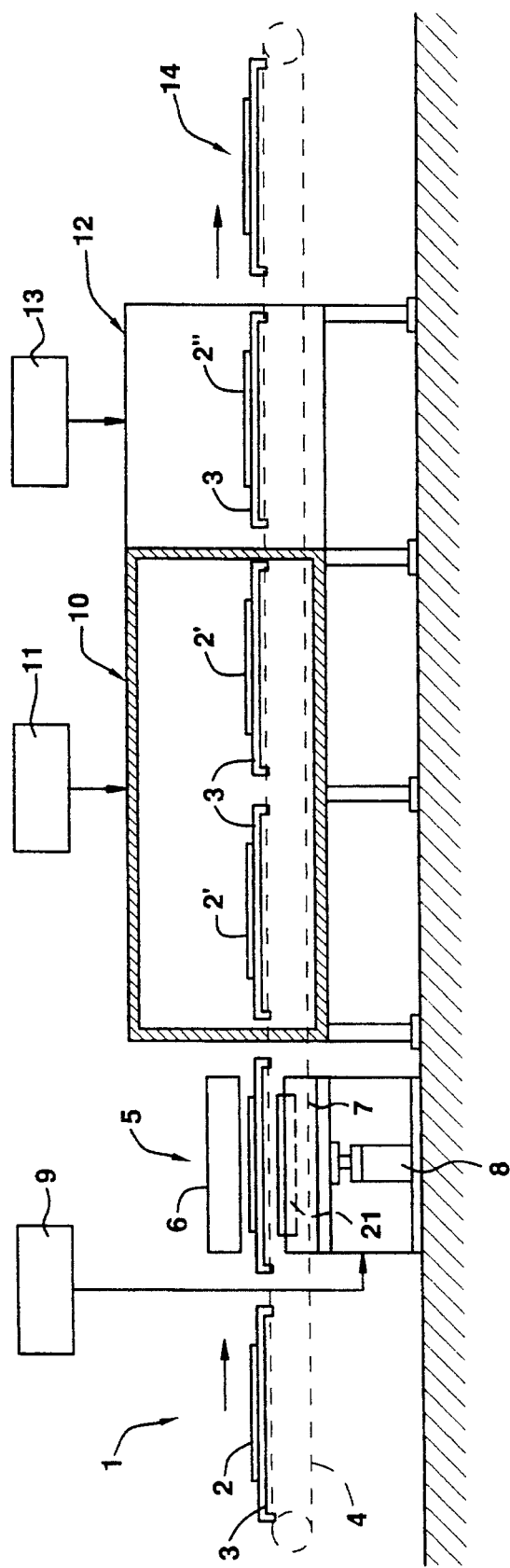

PROCESS FOR MANUFACTURING PHOTOVOLTAIC MODULES

BACKGROUND OF THE INVENTION

1. Technical Field of the Invention

The invention concerns a process for making photovoltaic modules and further a device to implement said process. Photovoltaic modules are solar energy generators and consist of a laminate containing as its core a system of solar cells such as silicon cells. This core layer allows only slight mechanical stresses and is imbedded in encapsulating materials. Such materials may be composed of one or more glass and/or plastic-foil layers and/or of plastic-foil composites.

2. State of the Art

U.S. Pat. No. 4,421,589 discloses the manufacture of known photovoltaic modules using vacuum lamination. A vacuum laminator is used which is divided by a flexible membrane into vacuum chambers, one chamber receiving a stack resting on a plate and constituted by the solar-cell system and the encapsulating materials and, where called for, separating foils. The plate temperature is kept below the softening point of the encapsulating materials. Next the two chambers are evacuated and the plate temperature is raised to the softening point of said encapsulating materials. Subsequently the upper chamber is ventilated and as a result the flexible membrane is forced against the stack. Thereby a composite is formed, composed of the system of solar cells and the encapsulating materials. The encapsulating materials are hardened by further raising the temperature and thereafter the plate is cooled and the laminate is removed from the vacuum chamber.

This procedure is very time-consuming because only one photovoltaic module at a time may be manufactured in one operational step. Moreover the plate in the vacuum laminator is used both as a heating and a cooling plate, whereby high energy losses are incurred.

SUMMARY OF THE INVENTION

The object of the invention is to eliminate the known drawbacks of the state of the art and to create an easily implemented economical and time-saving process for manufacturing photovoltaic modules.

The invention proposes a process for manufacturing photovoltaic modules in the form of a laminate containing a system of solar cells forming the core layer and clad by encapsulating materials composed of a glass/plastic composite and/or a plastic composite, said process comprising (a) a depositing module-stack composed of a system of solar cells, encapsulating materials and spacing foils on a carrier plate of which the temperature is held below the softening point of the plastic sealing layers present in the encapsulating materials, at a loading station, (b) moving the module-stack into a vacuum laminator which thereupon is closed and evacuated, and pressing a heating plate against the thermally conductive carrier plate to heat the plastic sealing layers to their softening point, (c) following ventilation of the vacuum laminator and without recooling the heating plate, moving the composite formed from the module-stack into the hardening oven where the plastic sealing layers are hardened to form a laminate, and (d) moving the laminate into a cooling zone and removing it at a removal station from the manufacturing process, wherein the process stages (a) through (e) are carried out simultaneously and in in a continuous manner.

The process of the invention allows continuous, low-energy manufacture of photovoltaic modules.

The invention offers further advantages in that ethylenevinyl acetate foils and/or silicone foils and/or casting resins and/or powder resins and/or plastic granulates are used as the plastic sealing layers in the encapsulating materials. Further the layers in the encapsulating materials advantageously may be composed of glass, plastic foils, plastic-foil composites or composites essentially consisting of plastic foils.

The process of the invention is furthermore characterized in that the plastic-foil composite used in the encapsulating material comprises, in the direction from the plastic sealing layer to the spacing foil, polyvinyl fluoride, polyethylene terephthalate and polyvinyl fluoride in foil form or a primer coat, polyethylene terephthalate in foil form and polyvinyl fluoride or a primer coat, polyethylene terephthalate in foil form and aluminum and polyvinyl fluoride.

Especially satisfactory bonding between the solar cell and the encapsulating material is achieved because of the advantageous selection of the substances used in the encapsulating materials.

The invention is moreover characterized by a device with which to implement the process for manufacturing laminated photovoltaic modules and comprises a loading station and a conveyor the carrier plate for the module-stack for moving a vacuum laminator with a stationary upper part with installed rubber membrane and a lower part which can be raised and lowered by a hydraulic device and housing a heater plate, a hardening oven, a cooling station and a removal station at which the carrier plate is returned by the conveyor to the loading station.

The device of the invention offers further advantages in that vacuum chambers are formed in the closed vacuum laminator. Advantageously, too, the pressure and the temperature in the vacuum laminator, the temperature in the hardening oven and the temperature in the cooling station each are set by external regulators.

The device of the invention moreover is advantageously characterized in that the carrier plate consists a thermally conductive core layer and also thermally conductive support layers, the core layer being a glass/plastic/metal composite and the support layers being sheetmetal. Furthermore the device of the invention comprises a heating plate mounted in the lower part of the vacuum laminator and lacking a cooling system, which is linked to the springs 20, 20'.

The advantageous designs of the device of the invention allow easily implementation of the process of the invention in an energy-saving manner.

DESCRIPTION OF THE FIGURES OF DRAWING

The invention is described in relation to FIGS. 1 and 2.

FIG. 1 shows a device with which to implement the method of the invention, namely a loading station 1 to deposit a module-stack 2 on the carrier plate 3 which is displaced by the conveyor 4 and the vacuum laminator 5 comprising a stationary upper part 6 and a lower part 7 which can be raised and lowered by the hydraulic device 8. The temperature and the dwell time in the laminator are set by the regulation system 9. FIG. 1 also shows the hardening oven 10 of which the temperature is set by the regulator 11, and the cooling zone 12 of which the temperature is set by the regulator 13, and the removal zone 14.

FIG. 1a is a cutaway of the vacuum laminator 5 in the open state, and further shows components not visible in FIG. 1 belonging to the upper and lower parts 6 and 7. As indicated, the upper part 6 contains the vacuum chamber segment 15 containing a rubber membrane 16. The vacuum chamber segment 15 moreover is fitted with a peripheral seal 17. The lower part 7 contains the vacuum chamber segment 18 to which is also mounted the peripheral seal 19. Also, the springs 20, 20' are present in the vacuum chamber 18 and support the heating plate 21.

FIG. 1b is a cutaway of the vacuum laminator 5 in the closed state under vacuum. By actuating the hydraulic device 8 of FIG. 1, the vacuum-laminator lower part 7 and thereby the vacuum-chamber segment 18 is displaced in the direction of the carrier plate 3, the heating plate 21 resting on the springs 20, 20' are forced against said plate 3. The seals 17 and 19 also are pressed by the actuated hydraulic device 3 against the carrier plate 3, as a result of which the vacuum laminator is closed and the vacuum chambers 22 and 23 are formed.

FIG. 1c shows the stratification of the carrier plate 3 consisting of the support layers 32, 32' and the core layer 33.

FIG. 2 shows the design of the module-stack 2 consisting of the solar-cell system 24 and the encapsulating materials 25, 25' enclosing said cell system, said stack being fitted with spacing foils 26, 26' resp. at its top and bottom sides. The system of solar cells comprises a row of silicon cells 27 soldered in series into sets by means of contact wires 28. The encapsulating material 25' comprises the plastic sealing layer 30' and the foil-composite 31. The encapsulating material 25 comprises the layer 29 which may be a glass layer as in FIG. 2 or a foil-composite similar to 31, and a plastic sealing layer 30.

DETAILED DESCRIPTION OF THE PREFERRED EMBODIMENT

The invention is elucidated below by means of an illustrative embodiment mode.

Figure 2:
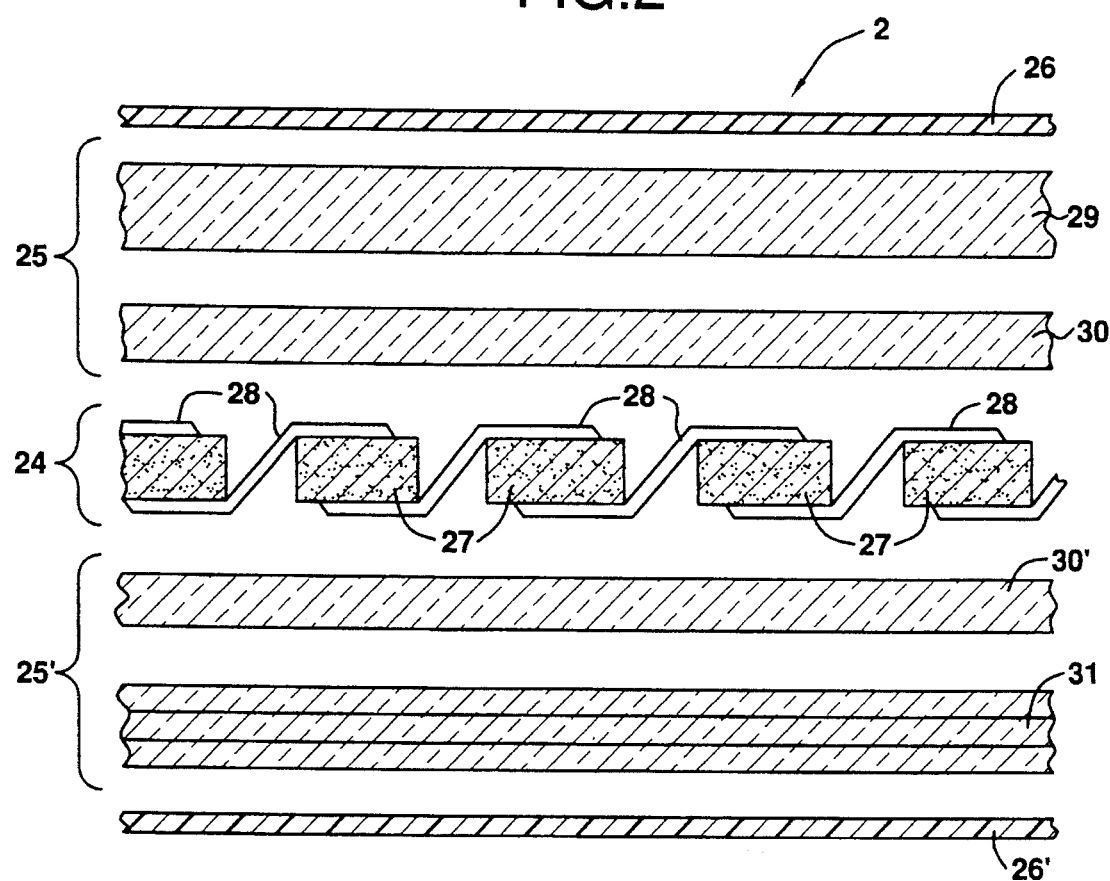

A module-stack 2, built up by depositing the individual components in the manner shown in FIG. 2, is placed at the loading station 1 on the carrier plate 3 at room temperature but no more than 80° C. The plastic sealing layers 30, 30' preferably are ethylenevinyl acetate (EVA) foils, silicone foils, casting resins, powder resins and plastic granulates that flow slightly when heated and crosslink thereby, so that plastic creep is averted.

The layer 29 may comprise a glass or be a foil composite similar to the foil composite 31. The table below shows the design of this foil composite, beginning with the layer adjoining the spacing foils 26, 25' and ending with the plastic sealing layers 30, 30' as shown in the Examples a–c:

TABLE

EXAMPLE a

Figure 1A:
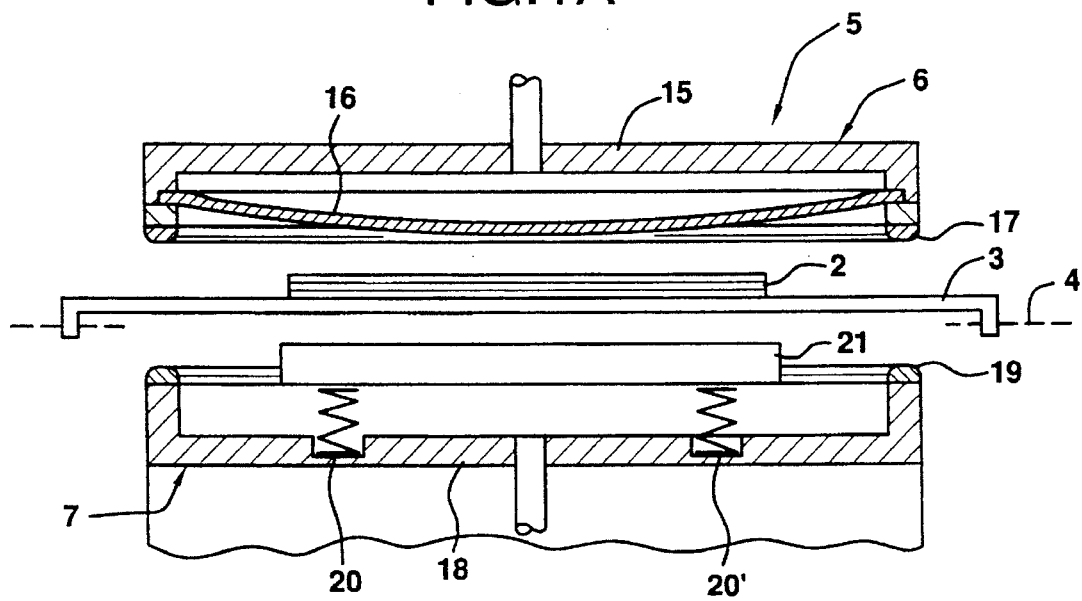

Spacing foil
Composite comprising polyvinylfluoride (PVF)
polyethyleneterephthalate (PETF)
polyvinylfluoride (PVF)
(all three in foil form)
Sealing layer
EXAMPLE b Spacing foil
Composite comprising a primer layer
polyethyleneterephthalate (PETF), in TABLE-continued foil form
polyvinylfluoride (PVF)
Sealing layer
EXAMPLE c Spacing foil
Primer coat
Polyethyleneterephthalate (PETF) in foil form
Aluminum
Polyvinyl fluoride (PVF)
Sealing layer The module-stack is fitted at its top and bottom sides with the spacing foils 26, 26' to preclude adhesion to the carrier plate 3 and to the other system parts. After the module-stack 2 has been deposited on the carrier plate 3, the latter is moved by the conveyor 4, for instance a chain conveyor, into the vacuum laminator 5 which is shown in detailed elevation in FIG. 1a. The temperature of the heating plate 21 is kept by an external regulator 9 at a value corresponding to the softening point of the plastics used in the sealing layer. The heater plate 21 is forced by the hydraulic device 8 against the carrier plate 3, whereby, depending on the heat flux inside the carrier plate, the plastic sealing layers 30, 30' in the module-stack are heated to their softening point. This controlled heat flux is further assured in that the carrier plate is protected foremost against heat dissipation by the peripheral seals 17 and 19 when the vacuum laminator is closed as in FIG. 1b. Furthermore the heat flux depends on the thermal conductivity of the carrier plate, said conductivity in turn depending as a material constant on the design of the carrier plate—see FIG. 1c. The heat conductivity can be adjusted by appropriately selecting the material of the core layer 33 and by the thickness of said core. Glass/plastic composites which where called for contain heat-conducting metallic additives are used for the core layer. Preferably metals such as aluminum or stainless steel are used for the carrier layers 32, 32'.

Figure 1B:
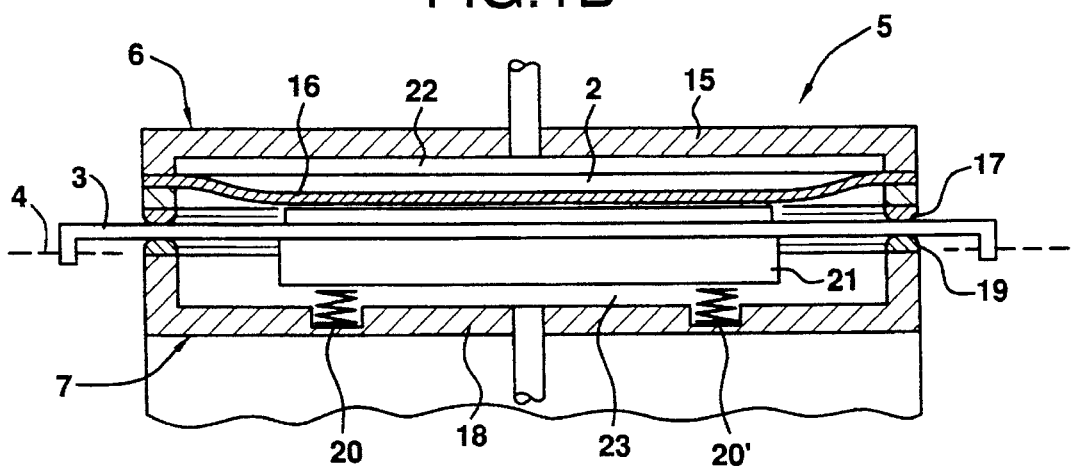
Figure 1C:
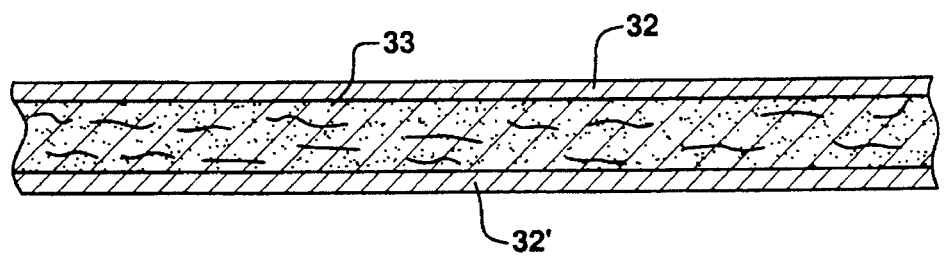

Vacuum is applied by means of the external regulator 9 after the laminator has been closed and as a result and shown in FIG. 1b the vacuum chambers 22 and 23 are then formed. Air and other volatile components are removed by said evacuation from the module-stack and thereby a bubble-free laminate will be achieved. Next the vacuum chamber 22 is ventilated, whereby the flexible membrane is forced against the module-stack. The vacuum chamber 23 is ventilated following a specific dwell time of the module-stack 2 in the vacuum laminator 5. A composite 2 is achieved between the components as shown in FIG. 2, and it remains stable in the absence of further compression in the hardening oven. This composite then is moved into the hardening oven 10 kept by the regulator 11 at a specified temperature, the sealing layers of the composite hardening during a specified dwell-time to form the laminate 2' which thereupon is moved into the cooling zone 12 where it is cooled to room temperature. This hardened laminate 2" is removed from the carrier plate at the removal station 14 and the carrier plate is returned to the loading station 1.

The photovoltaic modules manufactured in the manner of the invention are used for solar electric energy generation. Their applicability is manifold and range from small facilities for emergency phones, mobile homes, to roof and facade mounted panels to large-scale plants and solar power works.

We claim:

1. A method for manufacturing a laminated photovoltaic module comprising a core layer which is a system of solar cells clad by encapsulating materials consisting of glass/ plastic foil composites and/or plastic-foil composites, comprising:

depositing a module-stack comprising a solar cell system, encapsulating materials containing plastic sealing layers and spacing foils at a loading station onto a thermally conductive carrier plate, the temperature of said plate being maintained below the softening point of the plastic sealing layers in the encapsulating materials;

moving the module-stack from said loading station into a vacuum laminator which is then closed and evacuated;

heating the module-stack in said closed and evacuated vacuum laminator to the softening point of the plastic sealing layers by pressing a heater plate against the carrier plate;

ventilating the vacuum laminator to remove vacuum compression on the module-stack, without cooling the heater plate;

moving the module-stack into a hardening oven and heating it in said oven in the absence of compression to harden the plastic sealing layers to form a laminated module;

moving the laminated module into a cooling zone and cooling it therein; and removing the laminated module at a removal station.

2. The process of claim 1, wherein said plastic sealing layers are members of the group consisting of ethylenevinyl acetate foils, silicone foils, casting resins, powder resins, plastic granules and combinations thereof.

3. The process of claim 1, wherein said encapsulating material includes a glass layer.

4. The process of claim 1, wherein said encapsulating material includes a plastic foil layer.

5. The process of claim 1, wherein said encapsulating material includes a plastic composite layer.

6. The plastic process of claim 5, wherein said plastic composite layer consists essentially of plastic foils.

7. The process of claim 6, wherein said plastic composite layer, in the direction of the plastic sealing layer to the spacing foil, consists of polyvinyl fluoride polyethylene terephthalate and polyvinyl fluoride foils.

8. The process of claim 6, wherein said plastic composite layer, in the direction from the plastic sealing layer to the spacing foiling, consists of a primer layer, polyethylene terephthalate foil and polyvinyl fluoride foil.

9. The process of claim 6, wherein said plastic foil composite layer, in the direction from the plastic sealing layer to the spacing foil, consists of a primer layer, polyethylene terephthalate foil, aluminum and polyvinyl fluoride foil.

\* \* \* \* \*